(12) United States Patent
Jenne

(10) Patent No.: US 7,903,458 B1
(45) Date of Patent: *Mar. 8, 2011

(54) METHOD AND APPARATUS FOR REDUCTION OF BIT-LINE DISTURB AND SOFT-ERASE IN A TRAPPED-CHARGE MEMORY

(75) Inventor: Fredrick B. Jenne, Sunnyvale, CA (US)

(73) Assignee: Cypress Semiconductor Corporation, San Jose, CA (US)

( * ) Notice: Subject to any disclaimer, the term of this patent is extended or adjusted under 35 U.S.C. 154(b) by 54 days.

This patent is subject to a terminal disclaimer.

(21) Appl. No.: 11/966,631

(22) Filed: Dec. 28, 2007

Related U.S. Application Data

(63) Continuation of application No. 11/904,112, filed on Sep. 25, 2007.

(51) Int. Cl.
*G11C 16/04* (2006.01)
(52) U.S. Cl. ........... 365/185.02; 365/185.18; 365/185.24
(58) Field of Classification Search ............. 365/185.02, 365/185.18, 185.24, 185.19, 185.28
See application file for complete search history.

(56) References Cited

U.S. PATENT DOCUMENTS

| | | | |
|---|---|---|---|
| 5,317,535 A | 5/1994 | Talreja et al. | |
| 5,912,837 A | 6/1999 | Lakhani | |
| 5,999,444 A | 12/1999 | Fujiwara et al. | |
| 6,392,928 B1 * | 5/2002 | Roohparvar | 365/185.18 |
| 6,660,585 B1 | 12/2003 | Lee et al. | |
| 6,671,207 B1 * | 12/2003 | Parker | 365/185.22 |
| 6,744,675 B1 | 6/2004 | Zheng et al. | |
| 6,975,535 B2 * | 12/2005 | Kim et al. | 365/185.09 |
| 6,980,472 B2 | 12/2005 | Ditewig et al. | |
| 7,177,977 B2 | 2/2007 | Chen et al. | |
| 7,187,030 B2 | 3/2007 | Chae et al. | |
| 7,202,521 B2 | 4/2007 | Kim et al. | |
| 7,262,994 B2 | 8/2007 | Fong et al. | |
| 7,349,261 B2 | 3/2008 | Mokhlesi | |
| 7,692,961 B2 | 4/2010 | Eitan | |
| 2009/0080246 A1 * | 3/2009 | Jenne | 365/185.02 |

OTHER PUBLICATIONS

Fujiwara et al., "Metal-Oxide-Nitride-Oxide-Semiconductor Single Transistor Memory Cell with Separated Source Line," Journal of Applied Physics, Feb. 2000; 7 pages.
Wikipedia, the free encyclopedia, "Mosfet," Accessed Aug. 3, 2007; 13 pages.
International Search Report and Written Opinion of the International Searching Authority for International Application No. PCT/US07/20955 mailed May 5, 2008; 10 pages.
USPTO Notice of Allowance for U.S. Appl. No. 11/904,112 dated Dec. 1, 2009; 8 pages.
USPTO Notice of Allowance for U.S. Appl. No. 11/904,112 dated Aug. 6, 2009; 7 pages.
USPTO Notice of Allowance for U.S. Appl. No. 11/904,112 dated Feb. 25, 2009; 7 pages.

* cited by examiner

*Primary Examiner* — David Lam

(57) ABSTRACT

A method and device for trading off inhibit disturb against bit-line disturb in a non-volatile memory where a threshold shift per inhibit disturb is increased, a threshold shift per bit-line disturb is decreased and the total threshold shift over the expected lifetime of the non-volatile memory due to inhibit disturbs is approximately equalized with the total threshold shift over the expected lifetime of the non-volatile memory due to bit-line disturbs.

19 Claims, 16 Drawing Sheets

METHOD AND APPARATUS FOR REDUCTION OF BIT-LINE DISTURB AND SOFT-ERASE IN A TRAPPED-CHARGE MEMORY

CROSS REFERENCE TO RELATED APPLICATION

This application is a continuation application of U.S. application Ser. No. 11/904,112, filed Sep. 25, 2007, now issued U.S. Pat. No. 7,706,180.

TECHNICAL FIELD

Embodiments of the present invention relate to the programming of non-volatile memories and, in particular, to reducing the disturb effects on unselected memory cells during the programming of selected memory cells.

BACKGROUND

SONOS (silicon-oxide-nitride-oxide-silicon) is a nonvolatile, trapped-charge semiconductor memory technology that provides several advantages over conventional floating-gate flash memories, including immunity from single point failures and programming at lower voltages. In contrast to floating-gate devices, which store charge on a conductive gate, SONOS devices trap charge in a dielectric layer. SONOS transistors are programmed and erased using a quantum mechanical effect known as uniform channel, modified Fowler-Nordheim tunneling. This method of programming and erase is known in the industry to provide better reliability than other methods such as hot carrier injection. A SONOS transistor is an insulated-gate field effect transistor (IGFET) with a charge-trapping dielectric stack between a conventional control gate and a channel in the body or substrate of the transistor. A SONOS transistor can be fabricated as a P-type or N-type IGFET using CMOS (complementary metal-oxide-semiconductor) fabrications methods.

A SONOS transistor is programmed or erased by applying a voltage of the proper polarity, magnitude and duration between the control gate and the substrate. A positive gate-to-substrate voltage causes electrons to tunnel from the channel to a charge-trapping dielectric layer and a negative gate-to-channel voltage causes holes to tunnel from the channel to the charge-trapping dielectric layer. In one case, the threshold voltage of the transistor is raised and in the other case, the threshold voltage of the transistor is lowered. The threshold voltage is the gate-to-source voltage that causes the transistor to conduct current when a voltage is applied between the drain and source terminals. For a given amount of trapped charge, the direction of the threshold voltage change depends on whether the transistor is an N-type or P-type FET.

FIG. 1A illustrates the change in threshold voltage $V_T$ of an N-type SONOS transistor as a function of time for a programming voltage of +10 volts and an erase voltage of −10 volts. After approximately 10 milliseconds, the programmed threshold voltage is greater than +1 volt and the erased threshold is less than −1 volt. After a programming or erase operation is completed, the state of the transistor can be read by setting the gate-to-source voltage to zero, applying a small voltage between the drain and source terminals and sensing the current that flows through the transistor. In the programmed state, the N-type SONOS transistor will be OFF because the gate-to-source voltage will be below the programmed threshold voltage $V_{TP}$. In the erased state, the N-type SONOS transistor will be ON because the gate-to-source voltage will be above the erased threshold voltage $V_{TE}$. Conventionally, the ON state is associated with a logical "0" and the OFF state is associated with a logical "1."

FIG. 1B illustrates a small segment of a conventional array of one transistor (1T) N-type SONOS memory cells 100 containing four memory cells (A, B, C, D) in two rows (Row 0, Row 1) and two columns (Col 0, Col 1).

Each row includes a word line (WL0, WL1) that is used to select or deselect the row. All the cells share a common substrate voltage (SUB). Each column includes a source line (SL0, SL1) connected to the source terminals of all the transistors in that column, and a bit line (BL0, BL1) connected to the drain terminals of all the transistors in the column. Like other types of non-volatile memory, write operations in SONOS memories are performed on a row by row basis.

A write operation consists of a bulk erase operation on a row, followed by program or inhibit operations on individual cells in the row. Memory transistors that are to be written to a "1" (programmed) state are exposed to the full programming voltage (e.g., 10 volts). Memory transistors that are to be "written" to a "0" state are inhibited from programming because the previous bulk erase operation has already placed them in the "0" state. The inhibit function is accomplished applying an inhibit voltage to those memory transistors in the row that are to remain in the "0" or erased state, that lowers the total voltage across the transistor.

FIG. 1B illustrates a bulk erase operation on Row 0. As illustrated in FIG. 1B, the voltages are selected to impress −10 volts between the gates of transistors A and B and their respective source and substrate terminals. In Row 1, however, the word line (WL1) voltage is selected so that the gate-to-source and gate-to-substrate voltages on transistors C and D are all zero, so the states of transistors C and D are unchanged. In particular, transistor D, in a programmed state (shown schematically as a shaded trapping region to represent stored electrons), remains programmed and transistor C, in an erased state, remains erased.

FIG. 1C illustrates the second step in a conventional write operation on Row 0, where transistor A is being programmed (written to a "1") and transistor B is being inhibited from programming (written to a "0"). In this step, the word line voltages and common substrate voltages in both rows are reversed, and the bit line voltage on column 0 (BL0) is also reversed, but an intermediate voltage (+2 volts) is applied to the bit line of column 1 (BL1). When the word line (WL0) voltage of +6V is applied transistor B, it is turned on, and the +2V from the bit line (BL1) is transferred to its channel. This voltage reduces the gate-to-drain and channel voltage on transistor B (to +4 volts) reducing the programming field so that the threshold shift (VTE) of SONOS transistor 13 is small. The tunneling that does occur is known as "inhibit disturb" or soft-programming and causes a small increase in threshold voltage (around +200 mV) during the inhibit write operation.

In Row 1, the voltages on transistor C are all the same, so transistor C is unaffected by the write operation on Row 0. However, transistor D is affected (assumed to be programmed with trapped electrons in the memory layer). As a result of the inhibit voltage on BL1, the gate-to-drain voltage on transistor C is −6 volts. This voltage condition, which can erase the programmed SONOS transistor over long periods of disturb, causes hole tunneling from the drain, source, and channel to the memory layer. The tunneling that occurs is known as "bit line disturb" or soft erase and causes a small decrease in the threshold voltage of the programmed cell each time a cell in Column 1 in any other row is inhibited during a write operation on that row. However over many bit line disturb cycles, the threshold shift may cause cell read failures.

The maximum number of consecutive inhibit disturbs on an erased cell is limited to one (1) because the cell is always erased during the first part of a write operation. In contrast, the maximum number of consecutive bit line disturbs on a programmed cell in a given row and column is the total number of write operations on all other rows where an inhibit voltage is applied to the bit line on the given column. For example, if there are 64 rows in an array, and each row is written to (cycled) 100,000 times, then the maximum number of bit line disturbs that can be seen by the programmed cell is 64 minus 1 times 100,000, which equals 6,300,000 bit line disturbs. This means, statistically, that shifts in programmed threshold voltages are the limiting factor in conventional SONOS memories. The reliability of non-volatile memories is measured by their endurance (number of write cycles) and data retention. FIG. 1D is a graph comparing the data retention of an undisturbed SONOS cell and a programmed SONOS cell after 1,000,000 bit line disturbs as described above.

In FIG. 1D, the undisturbed SONOS cell exhibits a large initial separation at its beginning of life (BOL) between its programmed and erased threshold voltages. Over time, charge leakage causes the programmed threshold voltage to decrease and the erased threshold voltage to increase. A sense window for reading the cell (defined as the minimum threshold voltage that reliably represents a "1" and the maximum threshold voltage that reliable represents a "0") is positioned to maximize the time to the end of life (EOL) of the cell (so that on average, the programmed threshold voltage and erased threshold voltage decay to their respective sense window limits at the same time. In the case of the disturbed cell, however, the BOL value of the programmed threshold voltage is reduced by the cumulative effect of soft erase during cycling, and the rate of decay is increased because each bit line disturb may cause some damage to the tunneling layer that increases the charge leakage rate.

BRIEF DESCRIPTION OF THE DRAWINGS

The present invention is illustrated by way of example and not by way of limitation in the figures of the accompanying drawings, in which.

DETAILED DESCRIPTION

A non-volatile trapped-charge memory having reduced bit-line disturb is described herein. In the following description, numerous specific details are set forth such as examples of specific components, devices, methods, etc., in order to provide a thorough understanding of embodiments of the present invention. It will be apparent, however, to one skilled in the art that these specific details need not be employed to practice embodiments of the present invention. In other instances, well-known materials or methods have not been described in detail in order to avoid unnecessarily obscuring embodiments of the present invention.

Embodiments of the present invention are described herein using SONOS memory devices as examples of non-volatile trapped-charge memory devices for ease of description. However, embodiments of the invention are not so limited and may include any type of non-volatile, trapped-charge device.

Figure 1A:
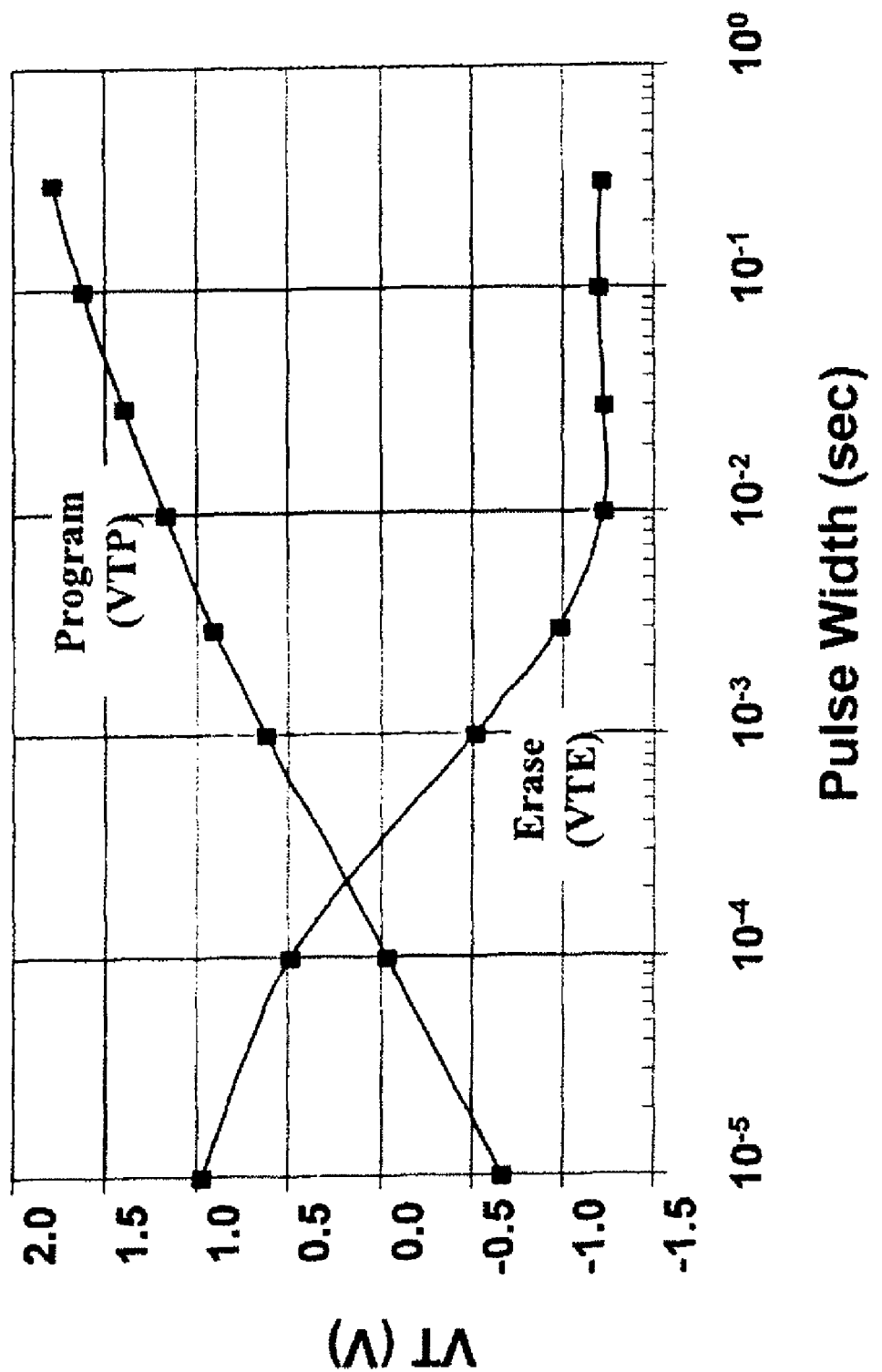
FIG. 1A illustrates programming and erase threshold voltages in a SONOS transistor.
Figure 1B:
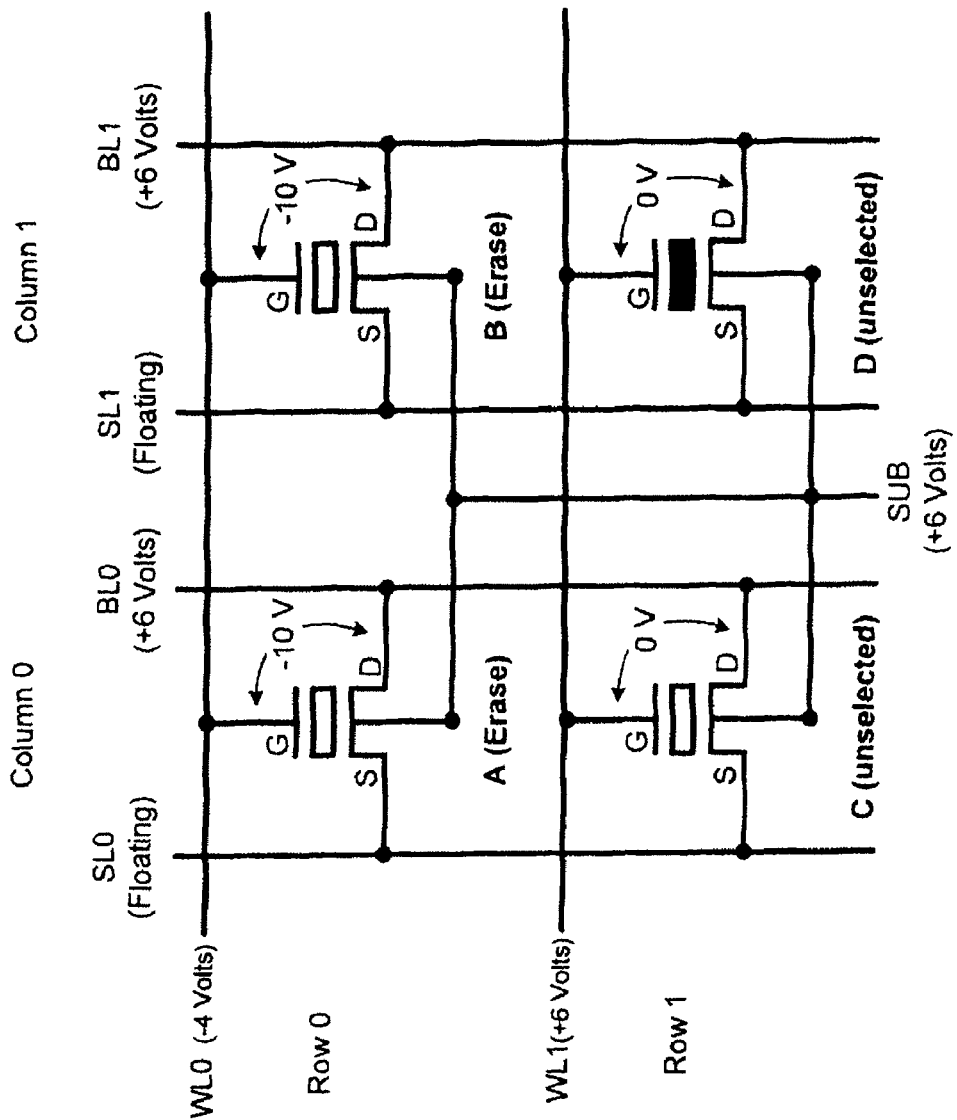
FIG. 1B illustrates a bulk erase operation in a conventional SONOS memory array.
Figure 1C:
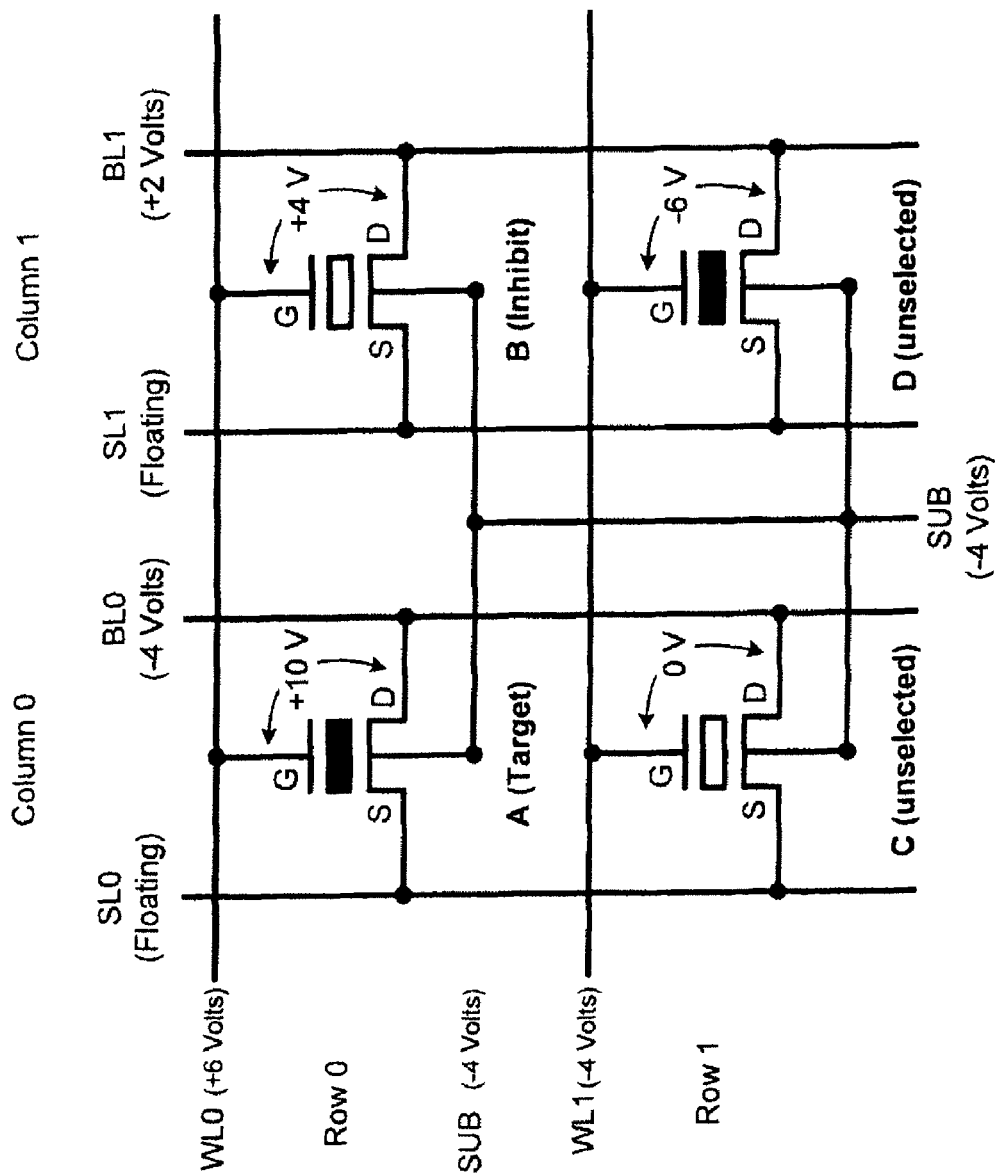
FIG. 1C illustrates a write operation in a conventional SONOS memory array.
Figure 1D:
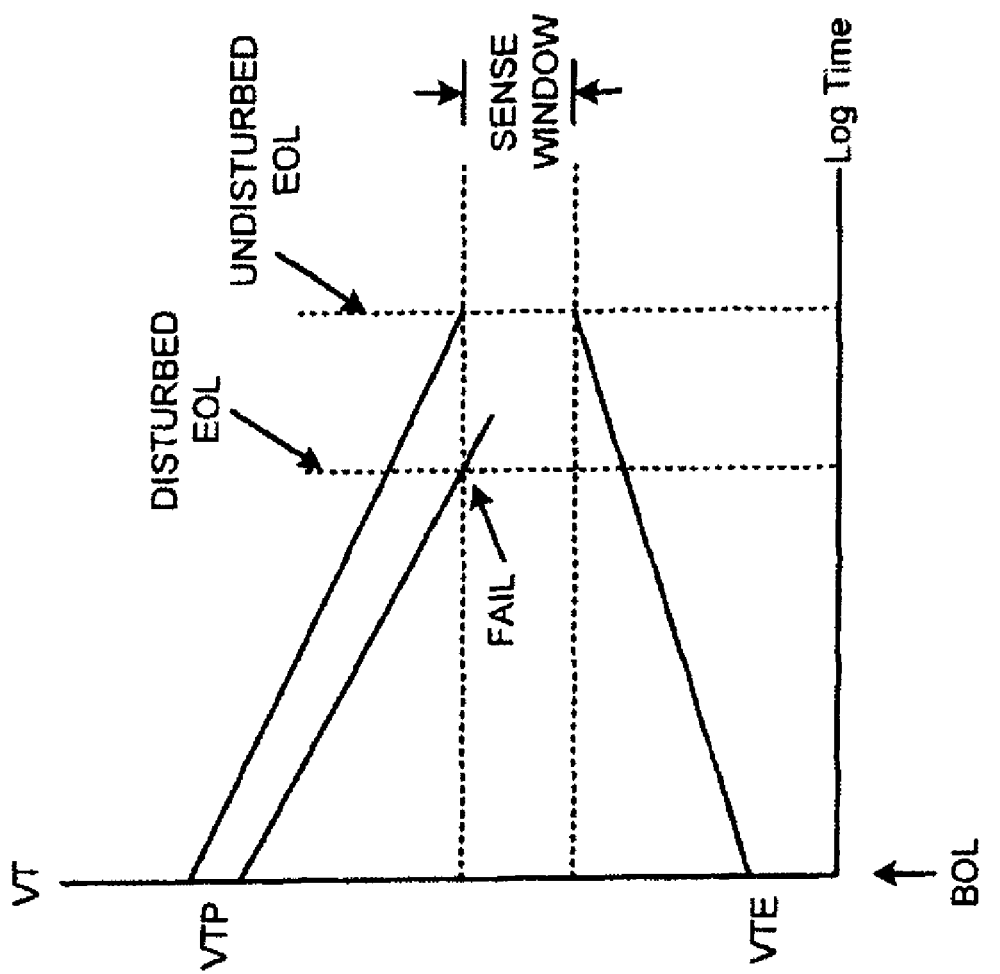
FIG. 1D illustrates the effect of bit line disturb in a conventional SONOS memory array.
Figure 2:
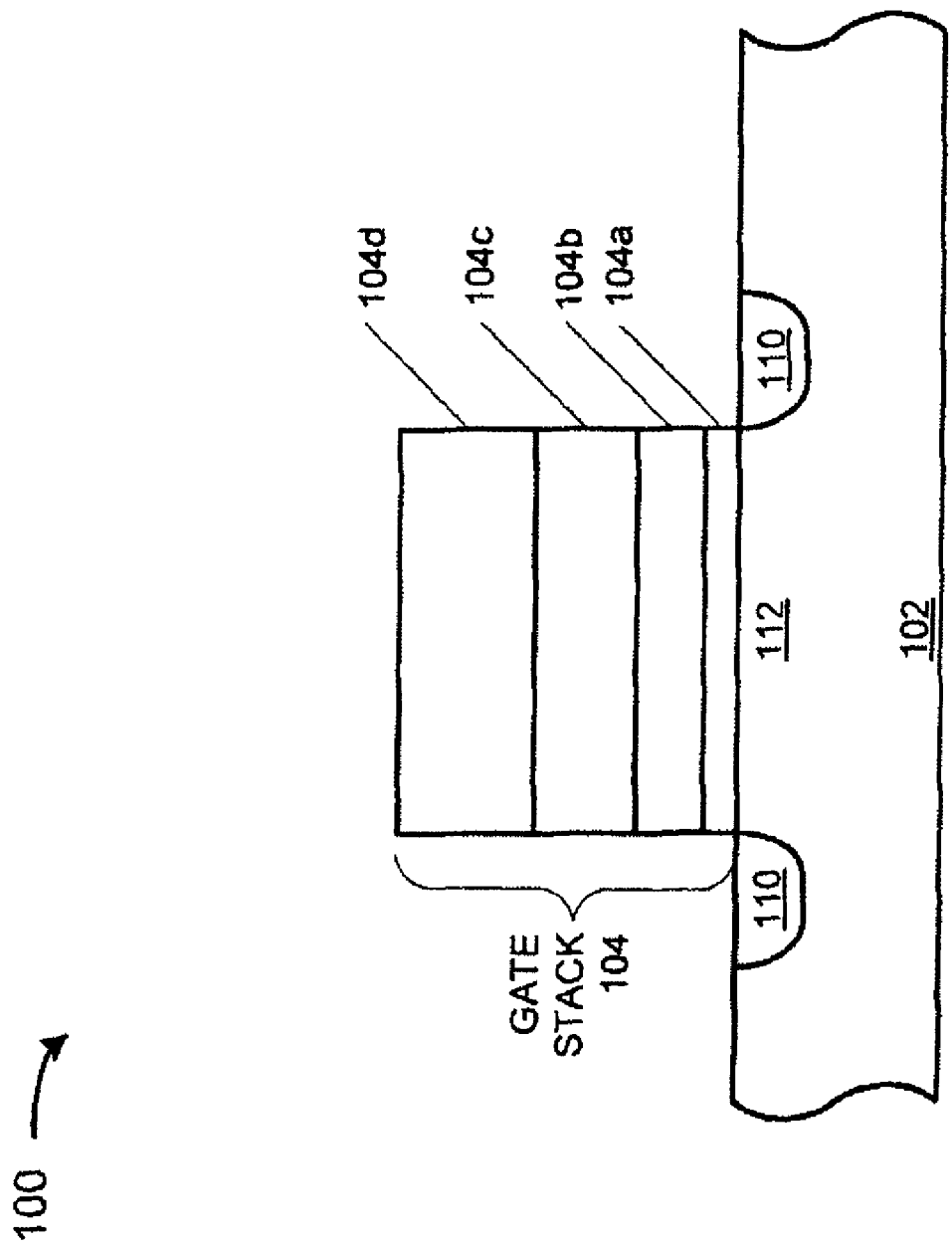
FIG. 2 illustrates the structure of a nonvolatile, trapped-charge semiconductor device in one embodiment.

FIG. 2 illustrates one embodiment of a non-volatile trapped-charge semiconductor device 100. Semiconductor device 100 includes a gate stack 104 formed over a substrate 102. Semiconductor device 100 further includes source/drain regions 110 in substrate 102 on either side of gate stack 104, which define a channel region 112 in substrate 102 underneath gate stack 104. Gate stack 104 includes a tunnel dielectric layer 104A, a charge-trapping layer 104B, a top dielectric layer 104C and a gate layer 104D. Gate layer 104D is electrically isolated from substrate 102 by the intervening dielectric layers.

Semiconductor device 100 may be any nonvolatile trapped-charge memory device. In accordance with one embodiment of the present invention, semiconductor device 100 is a SONOS-type device wherein the charge-trapping layer is an insulating dielectric layer having a concentration of charge-trapping sites. By convention, SONOS stands for "Semiconductor-Oxide-Nitride-Oxide-Semiconductor," where the first "Semiconductor" refers to the gate layer material, the first "Oxide" refers to the top dielectric layer (also known as a blocking dielectric layer), "Nitride" refers to the charge-trapping dielectric layer, the second "Oxide" refers to the tunnel dielectric layer and the second "Semiconductor" refers to the channel region. A SONOS-type device, however, is not limited to these specific materials.

Substrate 102 and, hence, channel region 112, may be any material suitable for semiconductor device fabrication. In one embodiment, substrate 102 may be a bulk substrate of a single crystal of a material which may include, but is not limited to, silicon, germanium, silicon/germanium or a III-V compound semiconductor material. In another embodiment, substrate 102 may be a bulk layer with a top epitaxial layer. In a specific embodiment, the bulk layer may be a single crystal of a material which may include, but is not limited to, silicon, germanium, silicon/germanium, a III-V compound semiconductor material and quartz, while the top epitaxial layer may be a single crystal layer which may include, but is not limited to, silicon, germanium, silicon/germanium and a III-V compound semiconductor material. In another embodiment, substrate 102 may be a top epitaxial layer on a middle insulator layer which is above a lower bulk layer. The top epitaxial layer may be a single crystal layer which may include, but is not limited to, silicon (e.g., to form a silicon-on-insulator semiconductor substrate), germanium, silicon/germanium and a III-V compound semiconductor material. The insulator layer may include, but is not limited to, silicon dioxide, silicon nitride and silicon oxy-nitride. The lower bulk layer may be a single crystal which may include, but is not limited to, silicon, germanium, silicon/germanium, a III-V compound semiconductor material and quartz. Substrate 102 and, hence, channel region 112, may include dopant impurity atoms. In a specific embodiment, channel region 112 is doped P-type and, in an alternative embodiment, channel region 112 is doped N-type.

Source/drain regions 110 in substrate 102 may be any regions having opposite conductivity to channel region 112. For example, in accordance with an embodiment of the present invention, source/drain regions 110 are N-type doped regions while channel region 112 is a P-type doped region. In one embodiment, substrate 102 and, hence, channel region 112, may be boron-doped single-crystal silicon having a boron concentration in the range of $10^{75}$-$10^{19}$ atoms/cm$^3$. Source/drain regions 110 may be phosphorous-doped or arsenic-doped regions having a concentration of N-type dopants in the range of $5 \times 10^{16}$-$5 \times 10^{19}$ atoms/cm$^3$. In a specific embodiment, source/drain regions 110 may have a depth in substrate 102 in the range of 80-200 nanometers. In accordance with an alternative embodiment of the present invention, source/drain regions 110 are P-type doped regions while channel region 112 is an N-type doped region.

Tunnel dielectric layer 104A may be any material and have any thickness suitable to allow charge carriers to tunnel into the charge-trapping layer under an applied gate bias. In one embodiment, tunnel dielectric layer 104A may be a silicon dioxide or silicon oxy-nitride layer formed by a thermal oxidation process. In another embodiment, tunnel dielectric layer 104A may be a high dielectric constant (high-k) material formed by chemical vapor deposition or atomic layer deposition and may include, but is not limited to, hafnium oxide, zirconium oxide, hafnium silicate, hafnium oxy-nitride, hafnium zirconium oxide and lanthanum oxide. In a specific embodiment, tunnel dielectric layer 104A may have a thickness in the range of 1-10 nanometers. In a particular embodiment, tunnel dielectric layer 104A may have a thickness of approximately 2 nanometers.

Charge-trapping layer 104B may be any material and have any thickness suitable to store charge and, hence, modulate the threshold voltage of gate stack 104. In one embodiment, charge-trapping layer 104B may be a dielectric material formed by a chemical vapor deposition process and may include, but is not limited to, stoichiometric silicon nitride, silicon-rich silicon nitride and silicon oxy-nitride. In one embodiment, the thickness of charge-trapping layer 104B may be in the range of 5-10 nanometers.

Top dielectric layer 104C may be any material and have any thickness suitable to maintain a barrier to charge leakage and tunneling under an applied gate bias. In one embodiment, top dielectric layer 104C is formed by a chemical vapor deposition process and is comprised of silicon dioxide or silicon oxy-nitride. In another embodiment, top dielectric layer 104C may be a high-k dielectric material formed by atomic layer deposition and may include, but is not limited to, hafnium oxide, zirconium oxide, hafnium silicate, hafnium oxy-nitride, hafnium zirconium oxide and lanthanum oxide. In a specific embodiment, top dielectric layer 104C may have a thickness in the range of 1-20 nanometers.

Gate layer 104D may be any conductor or semiconductor material suitable for accommodating a bias voltage during operation of the SONOS-type device. In accordance with an embodiment of the present invention, gate layer 104D may be doped poly-crystalline silicon formed by a chemical vapor deposition process. In another embodiment, gate layer 104D may be a metal-containing material formed by chemical or physical vapor deposition and may include, but is not limited to, metal nitrides, metal carbides, metal silicides, hafnium, zirconium, titanium, tantalum, aluminum, ruthenium, palladium, platinum, cobalt and nickel.

Figure 3:
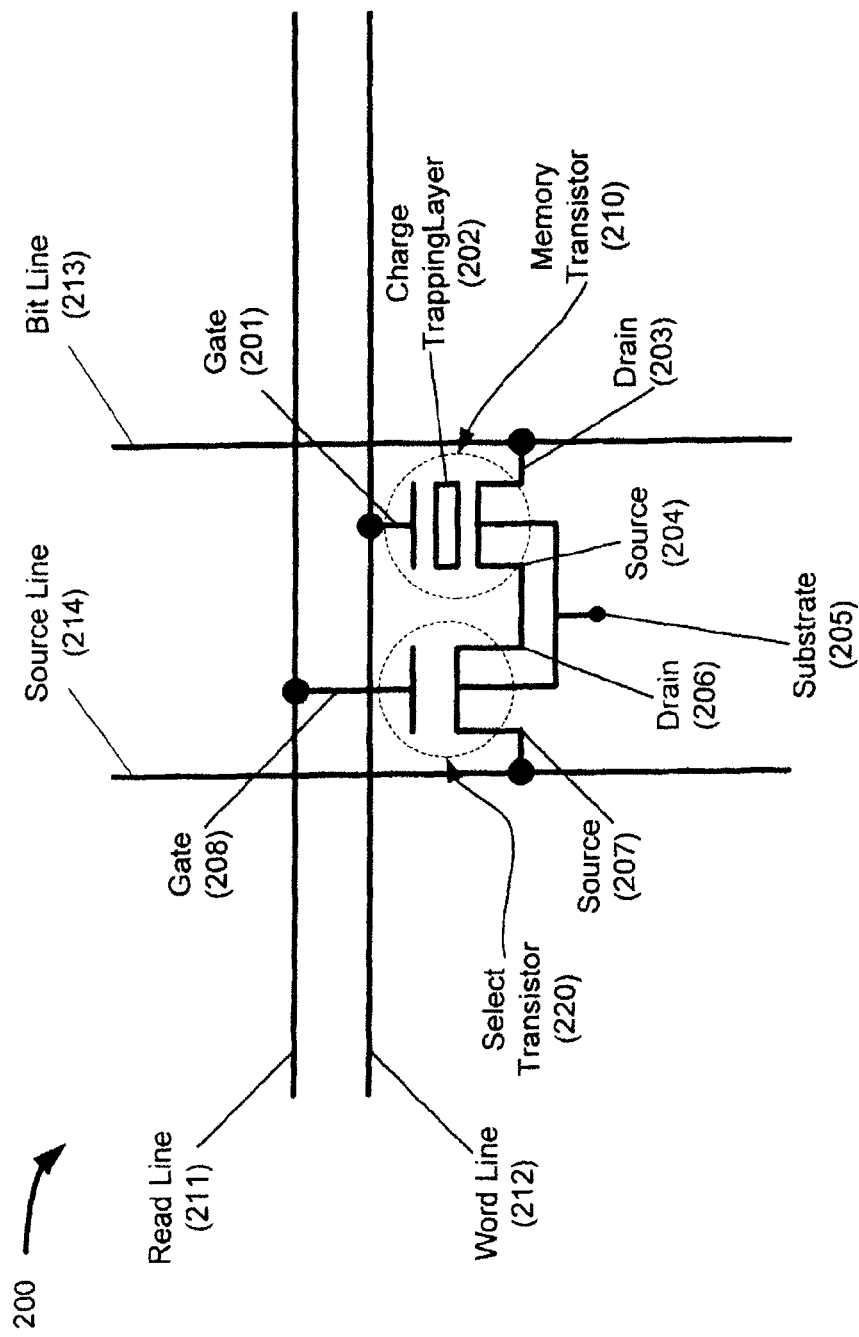
FIG. 3 illustrates a 2T memory cell in one embodiment.

FIG. 3 illustrates a memory cell 200 according to one embodiment of the present invention. In FIG. 3, memory cell 200 is a two transistor (2T) memory cell including a SONOS-type memory transistor 210 and a select transistor 220. Select transistor 220 may be, for example, a conventional IGFET sharing a common substrate connection 205 with memory transistor 210. Memory transistor 210 with a charge trapping layer 202 includes a drain 203 connected to a bit line 213, a gate 201 connected to a word line 212 and a source 204 connected to the drain 206 of the select transistor 220. Select transistor 220 also includes a source 207 connected to a source line 214 and a gate 208 connected to a select line 211.

Figure 4A:
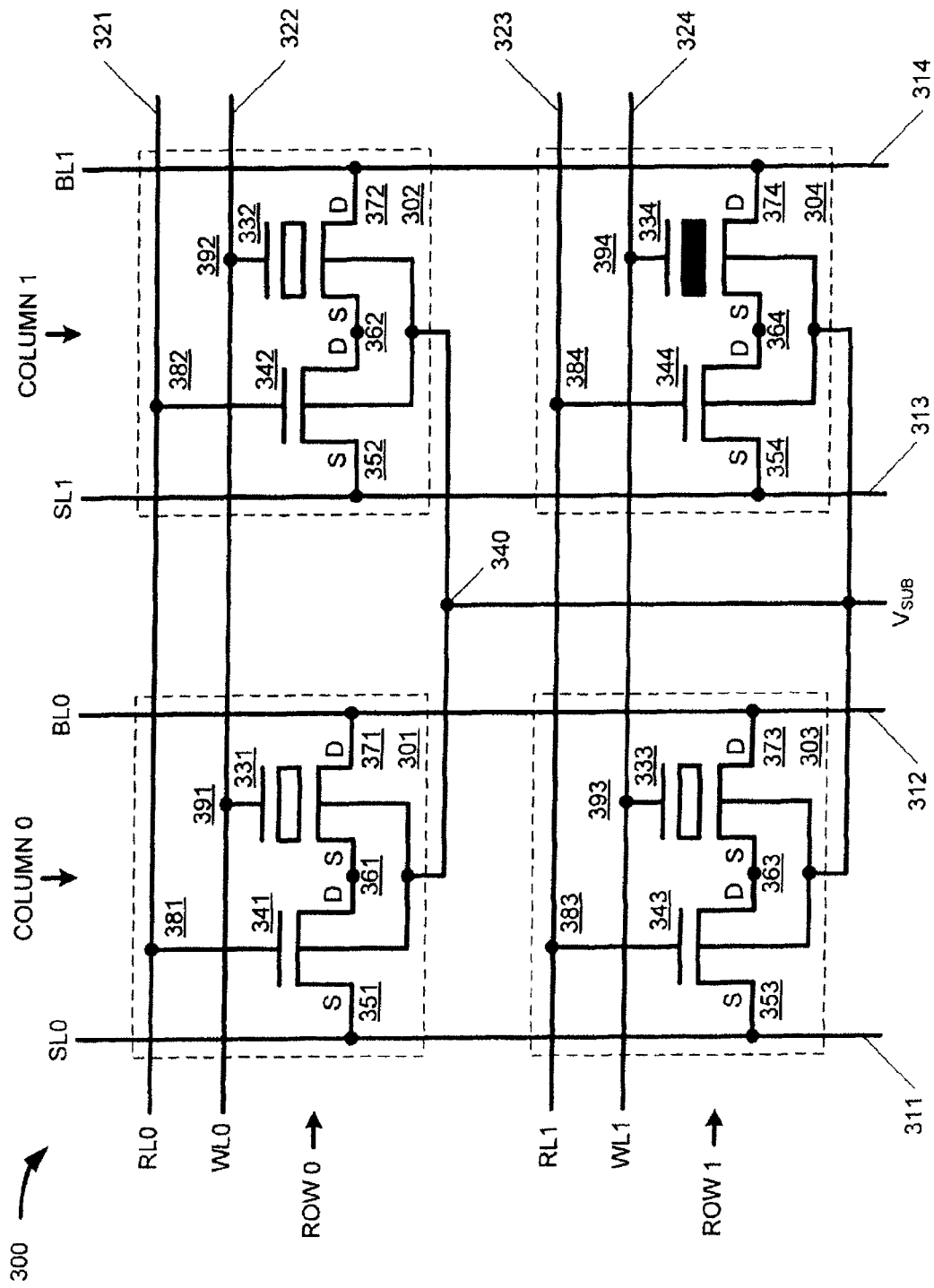
FIG. 4A illustrates a segment of a nonvolatile, trapped-charge memory array in one embodiment.

FIG. 4A illustrates an exemplary segment of a memory 300 according to one embodiment of the invention, which may be part of a large array of memory cells. In FIG. 4A, memory 300 includes four memory cells 301, 302, 303 and 304 arranged in two rows (ROW 0, ROW 1) and two columns (COLUMN 0, COLUMN 1). Each of cells 301-304 may be structurally equivalent to cell 200 describe above.

Cell 301 in ROW 0 and COLUMN 0 includes memory transistor 331 and select transistor 341. The drain 371 of memory transistor 331 is connected to bit line 312 (BL0), the gate 391 of memory transistor 331 is connected to word line 322 (WL0) and the source of memory transistor 331 is connected to the drain of select transistor 341 at common node 361. The gate 381 of select transistor 341 is connected to read line 321 (RL0) and the source 351 of select transistor 341 is connected to source line 311 (SL0).

Cell 302 in ROW 0 and COLUMN 1 includes memory transistor 332 and select transistor 342. The drain 372 of memory transistor 332 is connected to bit line 314 (BL1), the gate 392 of memory transistor 332 is connected to word line 322 (WL0) and the source of memory transistor 332 is connected to the drain of select transistor 342 at common node 362. The gate 382 of select transistor 342 is connected to read line 321 (RL0) and the source 355 of select transistor 342 is connected to source line 313 (SL1).

Cell 302 in ROW 0 and COLUMN 1 includes memory transistor 332 and select transistor 342. The drain 372 of memory transistor 332 is connected to bit line 314 (BL1), the gate 392 of memory transistor 332 is connected to word line 322 (WL0) and the source of memory transistor 332 is connected to the drain of select transistor 342 at common node 362. The gate 382 of select transistor 342 is connected to read line 321 (RL0) and the source 352 of select transistor 342 is connected to source line 313 (SL1).

Cell 303 in ROW 1 and COLUMN 0 includes memory transistor 333 and select transistor 343. The drain 373 of memory transistor 333 is connected to bit line 312 (BL0), the gate 393 of memory transistor 333 is connected to word line 324 (WL1) and the source of memory transistor 333 is connected to the drain of select transistor 343 at common node 363. The gate 383 of select transistor 343 is connected to read line 323 (RL1) and the source 353 of select transistor 343 is connected to source line 311 (SL0).

Cell 304 in ROW 1 and COLUMN 1 includes memory transistor 334 and select transistor 344. The drain 374 of memory transistor 334 is connected to bit line 314 (BL1), the gate 394 of memory transistor 334 is connected to word line 324 (WL1) and the source of memory transistor 334 is connected to the drain of select transistor 344 at common node 364. The gate 384 of select transistor 344 is connected to read line 323 (RL1) and the source 354 of select transistor 344 is connected to source line 313 (SL1). In addition, all of the transistors in memory array 300 may share a common substrate node 340.

In the following description, for clarity and ease of explanation, it is assumed that all of the transistors in memory array 300 are N-type field effect transistors. It will be appreciated, without loss of generality that a P-type configuration can be described by reversing the polarity of the applied voltages, and that such a configuration is within the contemplated embodiments of the invention.

Figure 4B:
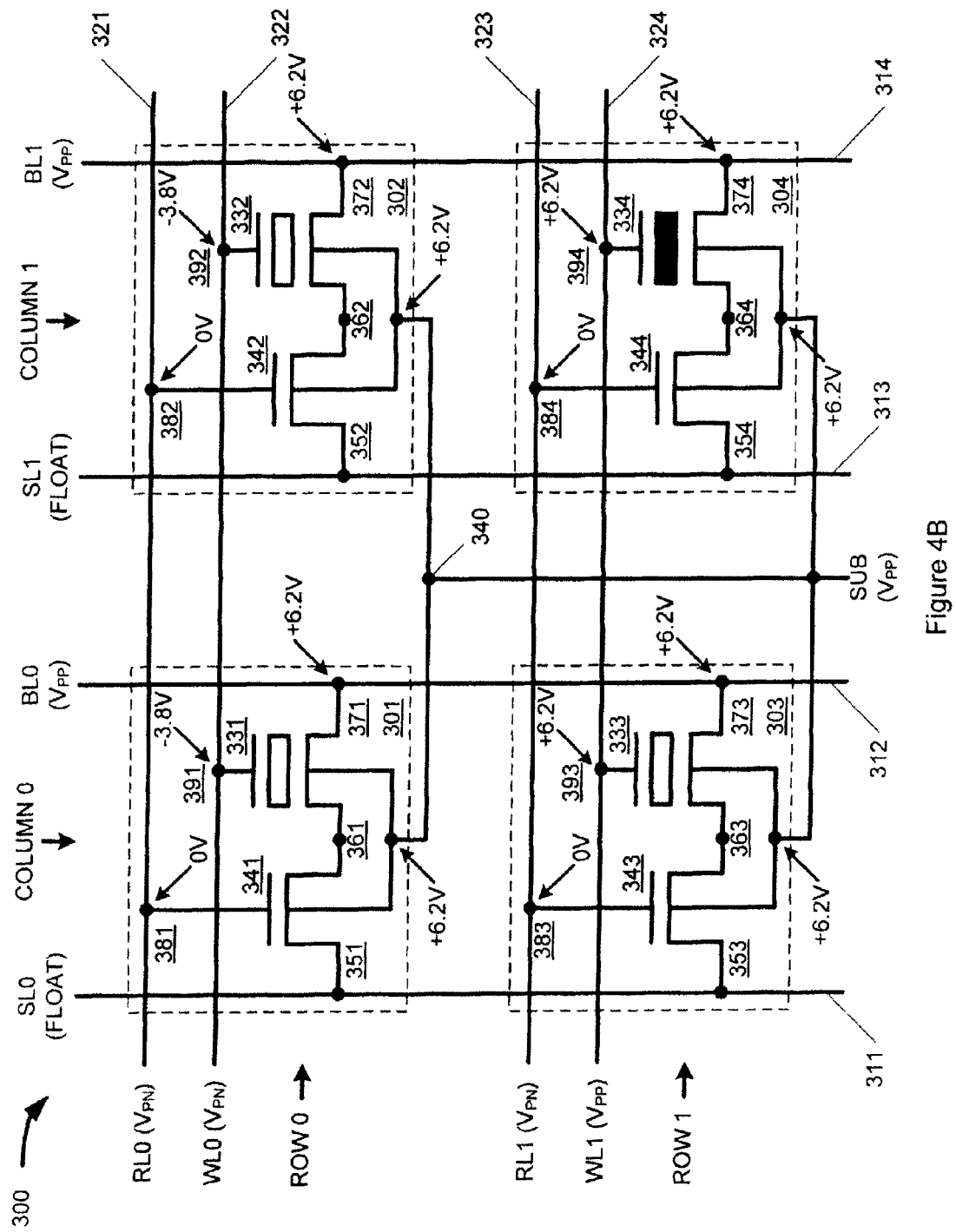
FIG. 4B illustrates an erase operation in a nonvolatile trapped-charge memory array in one embodiment.

FIG. 4B illustrates a bulk erase operation on a selected row (ROW 0) in memory array 300, in one embodiment, that erases memory cell 301 and memory cell 302 .... In FIG. 48, a negative voltage ($V_{PN}$) is applied on RL0 (321), WL0 (322), and a positive voltage ($V_{PP}$) is applied on BL0 (312), BL1 (314) and the common substrate node SUB (340). In the embodiment shown in FIG. 413, $V_{PN}$ is selected to be approximately −3.8V and $V_{PP}$ is selected to be approximately +6.2V, such that the absolute difference between $V_{PP}$ and $V_{PN}$ is approximately 10V. In other embodiments, the values of $V_{PP}$ and $V_{PN}$ may be varied and the absolute difference may be greater than or less than 10V.

As a result of the applied voltages, select transistors 341 and 342 are biased OFF so that the sources 361 and 362 of memory transistors 331 and 332 are isolated from and undisturbed by the floating voltages on SL0 (311) and SL1 (313). Memory transistors 331 and 332 both have negative gate-to-substrate voltages and gate-to-drain voltages which are sufficient to cause holes to tunnel into their respective charge-trapping layers, rendering the transistors in an ON-state when the bias voltages are removed as described above.

Memory cells 303 and 304, in ROW, which share bit lines 312 and 314 with cells 301 and 303, respectively, are protected from the ROW 0 erase operation by the application of a different word line voltage. In particular, $V_{PP}$ is applied to WL1 (324) such that the gate-to-substrate and gate-to-drain voltages of memory transistors 333 and 334 are approximately 0V, which is insufficient to induce tunneling.

Figure 4C:
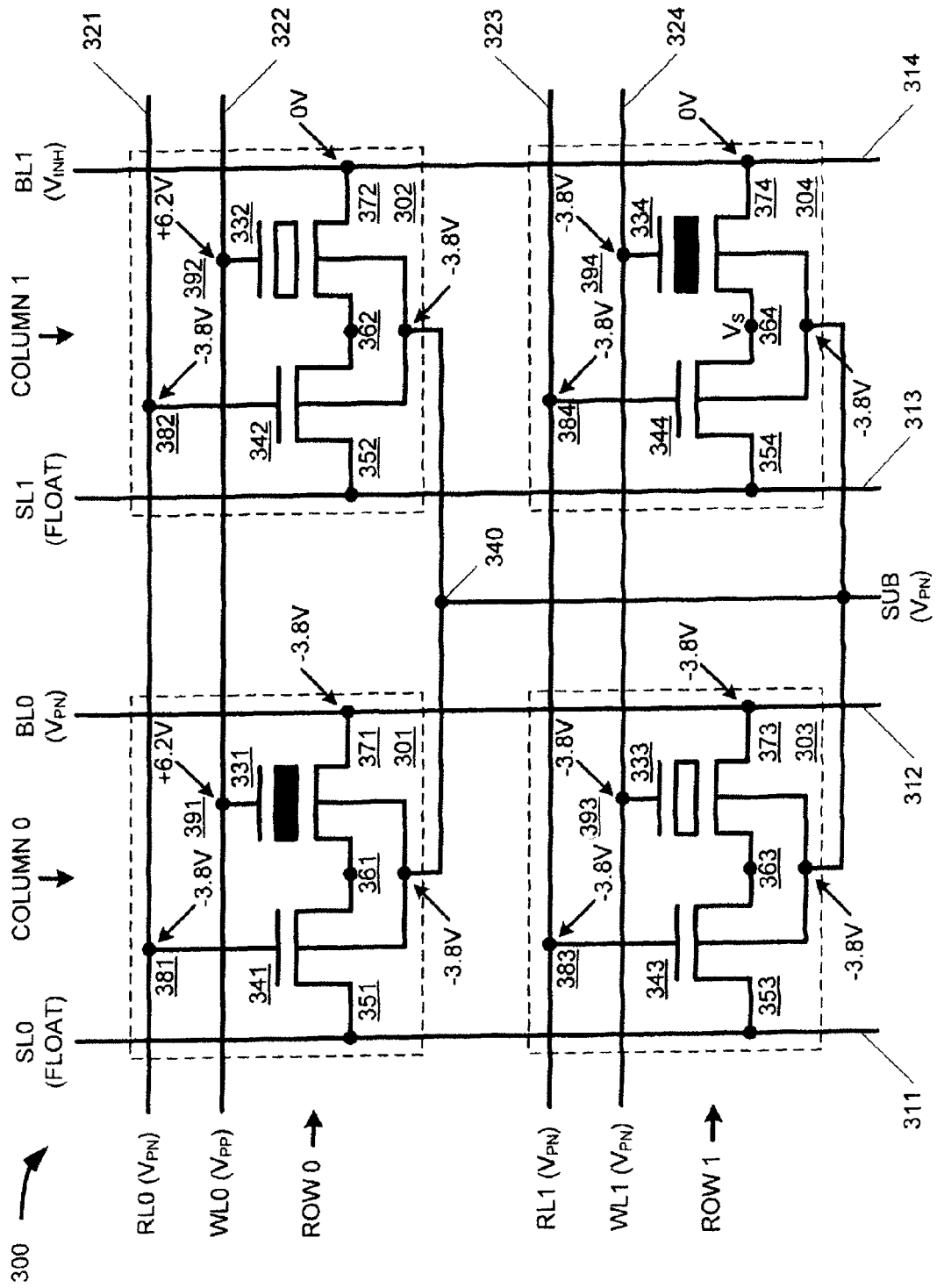
FIG. 4C illustrates a write operation in a nonvolatile trapped-charge memory array in one embodiment.

FIG. 4C illustrates a write operation on ROW 0 of memory array 300, according to one embodiment of the invention. In FIG. 4C, cell 301 is the targeted cell to be written to a logic "1" state (i.e., programmed to an ON state) and cell 302 is to be written to a logic "0" state. However, since cell 302 is already erased to a logic "0" state by the preceding bulk erase operation (FIG. 4B), writing a logic "0" is equivalent to inhibiting cell 302 from programming. These two objectives (programming cell 301 and inhibiting cell 302) are accomplished by applying different bias voltages. $V_{PN}$ is applied to RL0 (321), BL0 (312) and substrate node 340, while $V_{PP}$ is applied to WL0 (322). In addition, and as described in greater detail below, a selected inhibit voltage VINH is applied to BL1 (314).

As a result of the applied voltages, select transistor 341 is biased OFF with a 0V gate-to-substrate voltage (it is assumed that select transistors 341, 342, 343 and 344 all have intrinsic threshold voltages in the range of +1V), which isolates the source 361 of memory transistor 331 from the floating voltage on BL0 (311). Memory transistor 331 is exposed to a gate-to-substrate and gate-to-drain voltage of approximately +10V, which is sufficient to cause electrons to tunnel to the charge trapping layer of memory transistor 302 and place memory transistor 331 in an OFF state when the bias voltage are removed.

In memory cell 302, select transistor is in the same state as select transistor 331, biased off and isolating the source 362 of memory transistor from the floating voltage on SL1 (313). However, memory transistor 332 is inhibited from programming by the application of an inhibit voltage of approximately 0 volts, which clamps the gate-to-drain, gate-to-channel, and gate-to-source voltages of memory transistor 332 at approximately 6.2V.

In ROW 1, memory cell 303 is protected from the programming operation on cell 303 by the application of $V_{PN}$ to WL1 (324), which clamps the gate-to-drain and gate-to-substrate voltages of memory transistor 333 to approximately 0 volts. Select transistor is biased OFF, which isolates the source 363 of memory transistor 333 from the floating voltage on SL0 (311). In memory cell 304, select transistor 344 is also biased OFF to isolate memory transistor 334 from the floating voltage on SL1 (313). For the embodiment illustrated, the gate-to-drain voltage of memory transistor 334 is approximately −3.8V, which is a soft-erase condition as described above. It will be appreciated, however, that the soft-program condition (inhibit disturb) on memory transistor 332 and the soft-erase condition (bit line disturb) on memory transistor are approximately inverted from the conventional memory described above.

In one embodiment, a method for reducing soft-erase includes reducing a bit line disturb voltage on a programmed memory cell (such as memory cell 304) by decreasing the bit line disturb voltage at the expense of an increase inhibit disturb voltage on the bit line, wherein an accumulated bit line disturb over the life of the memory cell is approximately equalized with the magnitude of any single inhibit disturb on the bit line.

Figure 5A:
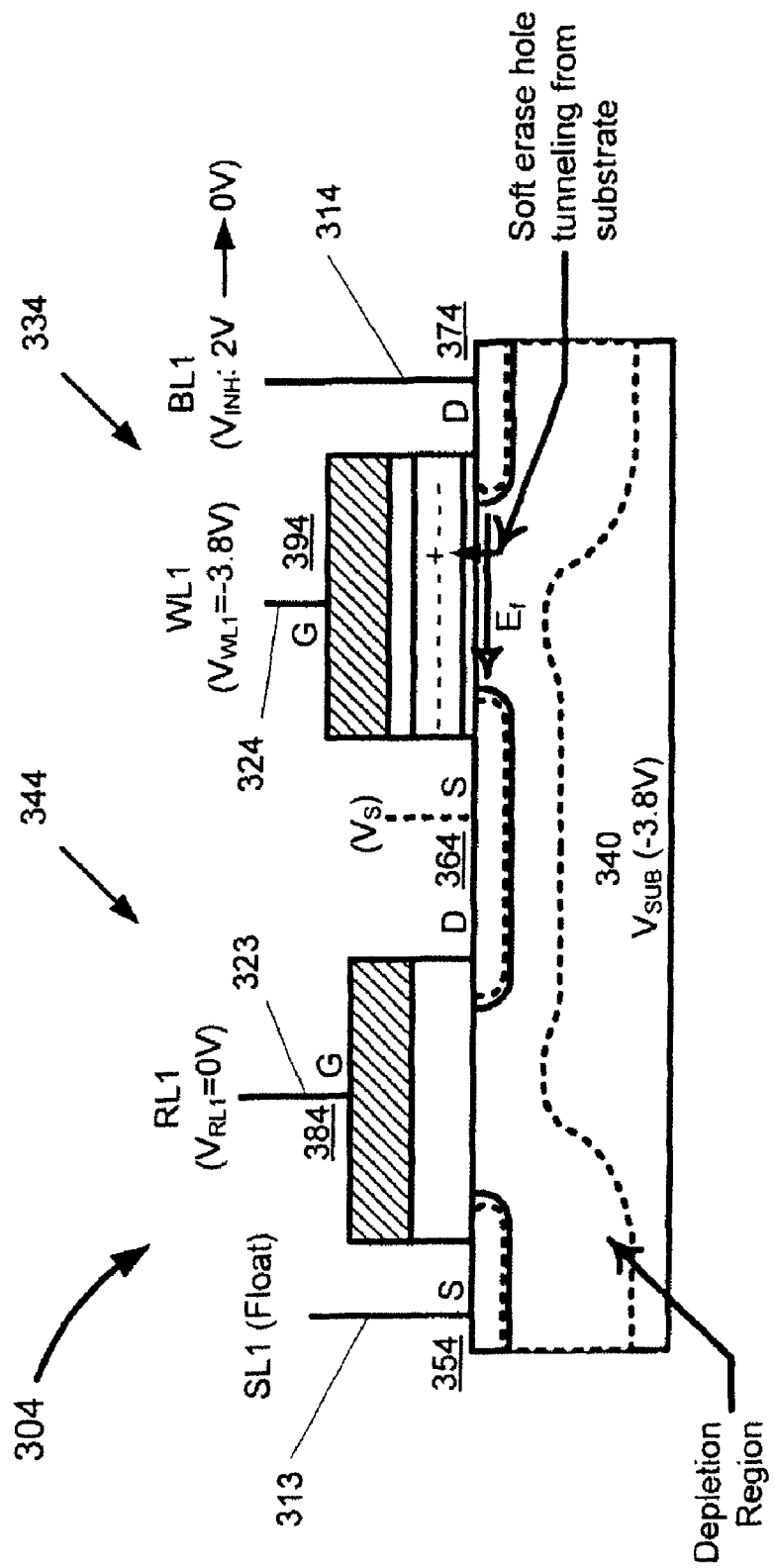
FIG. 5A illustrates reduction of bit line disturb in one embodiment.

FIG. 5A is a cross-section of memory cell 304 illustrating the reduction of soft-erase due to bit line disturb in one embodiment. In FIG. 5A, $V_{INH}$ on the drain 374 of memory transistor 334 of is positive relative to $V_{WL1}$ on WL1. With $V_{RL1}$=0 volts on the gate 384 of select transistor 344 $V_S$, the voltage on source 364 floats to a threshold voltage (approximately 1 volt) below $V_{RL1}$ or to approximately −1 volt. In this state, there is an electric field Et between the drain 374 and the source 364 of transistor 334 with a positive voltage gradient relative to the gate 394 of memory transistor 334. The voltage gradient causes holes to tunnel to the charge-trapping layer where they annihilate electrons and produce a soft-erase disturb. In one embodiment, as illustrated in FIG. 5A, $V_{INH}$ may be reduced (e.g., from 2V to 0V). Reducing $V_{INH}$ reduces Ef and the associated voltage gradient with respect to the gate 394. As a result, hole tunneling is reduced. The reduction of soft-erase under the conditions described above may be limited because the threshold voltage of memory transistor 334 is dominated by the trapped charge on the source side of memory transistor and the voltage gradient reduction due to the decreases inhibit voltage on the drain 374 is attenuated at the source 364.

Figure 5B:
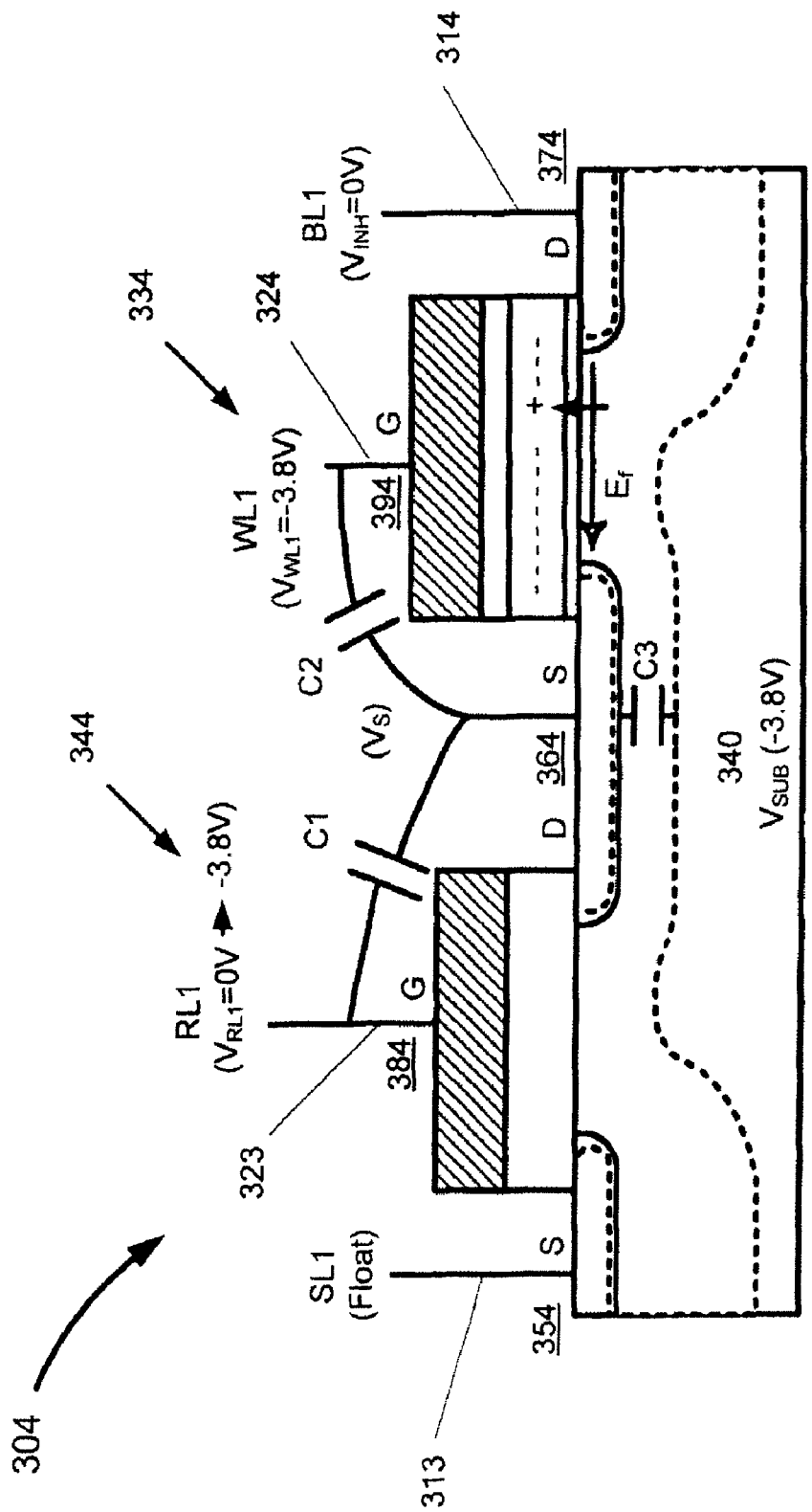
FIG. 5B illustrates soft-erase reduction in one embodiment.

In one embodiment, a method for reducing soft-erase includes decreasing the voltage at the floating source 364 of memory transistor 334 by driving select transistor 344 to a hard-turnoff condition FIG. 5B illustrates memory cell 304 showing internal nodal capacitances. In FIG. 5B, capacitor C1 is the gate-to-drain capacitance of select transistor 344, C2 is the gate-to-source capacitance of memory transistor 334 and C3 is the source-to-substrate capacitance of memory transistor 334. As noted above, if the gate 384 of select transistor 344 is held at the conventional value of 0 volts, then source 364 floats to a value that disturbs the stored charge at the source side of memory transistor 334. In one embodiment, as illustrated in FIG. 5B, the voltage $V_{RL1}$ on gate 384 of select transistor 344 may be reduced from 0V to a more negative voltage (such as VSUB, for example). The negative voltage places select transistor 344 in an OFF condition and the negative voltage is coupled to the source 364, which drives source 364 more negative. As a result, the voltage gradient between gate and source of memory transistor is reduced and the source side soft-erase is reduced. The actual value of $V_S$ is a function of $V_{RL1}$, and the capacitances C1, C2 and C3, which can be controlled with fabrication process variations.

Figure 5C:
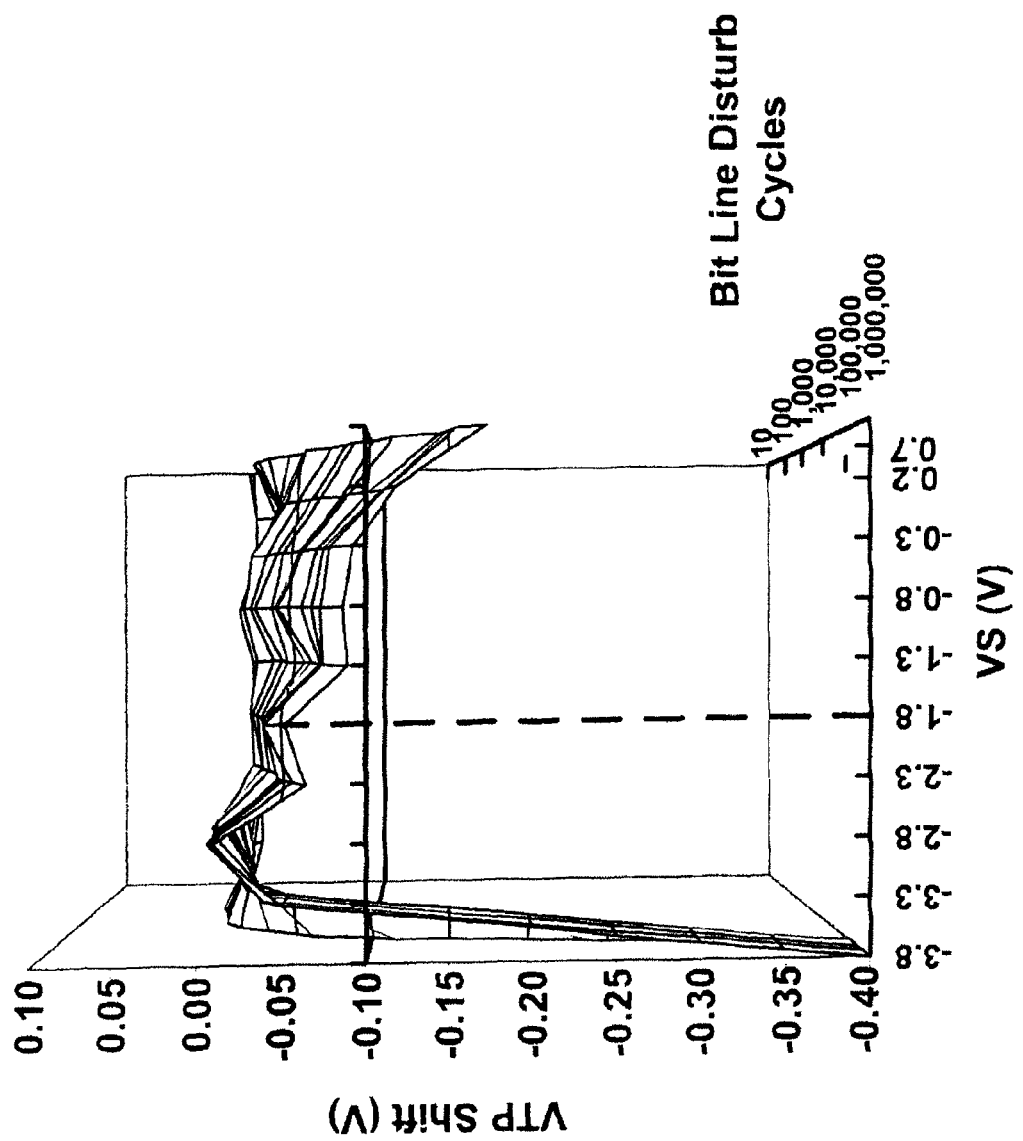
FIG. 5C is a graph illustrating program threshold shift in a nonvolatile, trapped-charge semiconductor device in one embodiment.

FIG. 5C is a graph illustrating the relationship between the shift in the programmed threshold voltage of memory transistor as a function of source voltage and number of endurance cycles. It can be seen that a source voltage of −1.8 volts is approximately midway between the points where the threshold voltage SHIFT exceeds 100 millivolts after 1 million endurance cycles. It will be appreciated that the optimum value for $V_S$ may differ from this value depending on various factors such as processing technology, device geometry, etc.

Figure 6A:
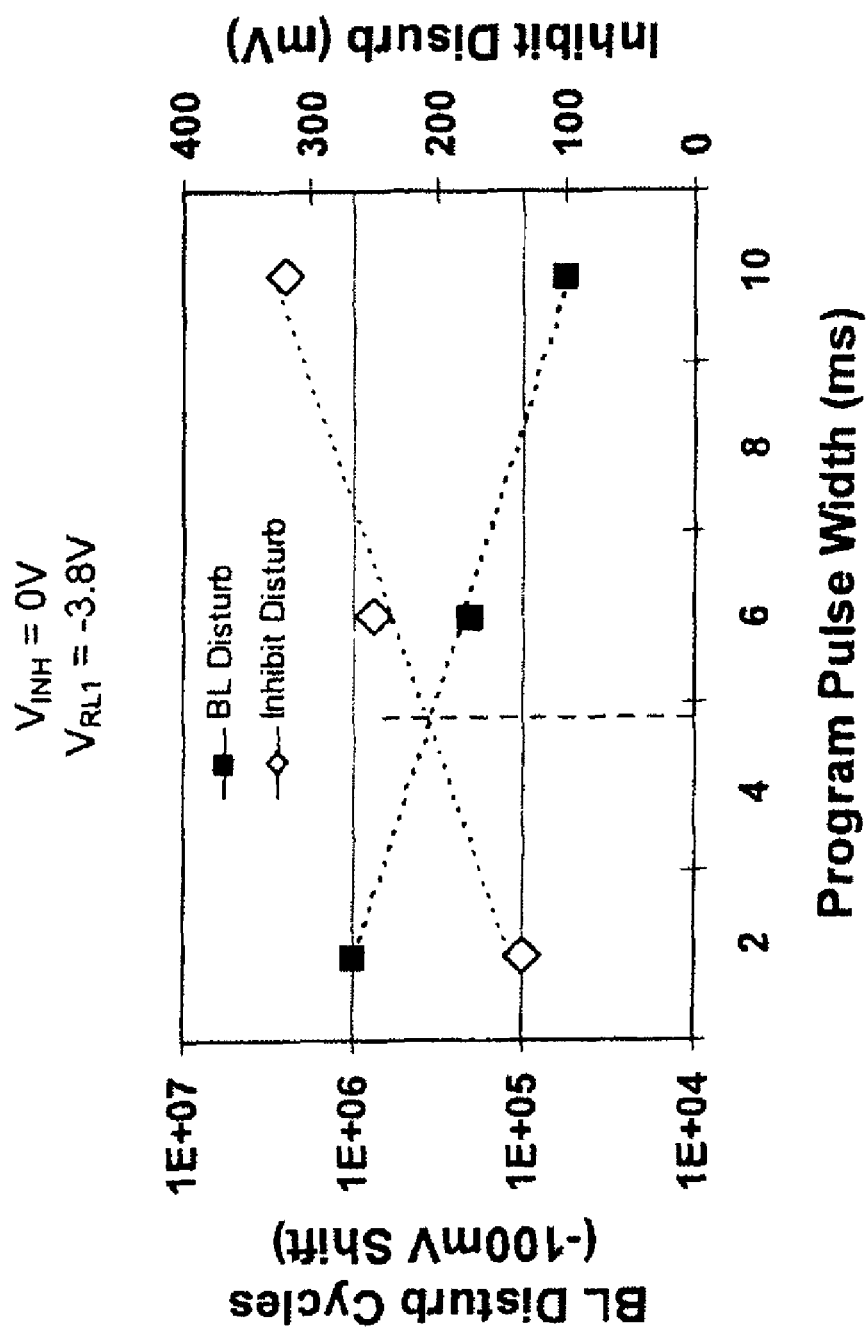
FIG. 6A is a graph illustrating a tradeoff between bit line disturb and inhibit disturb in one embodiment.
Figure 6B:
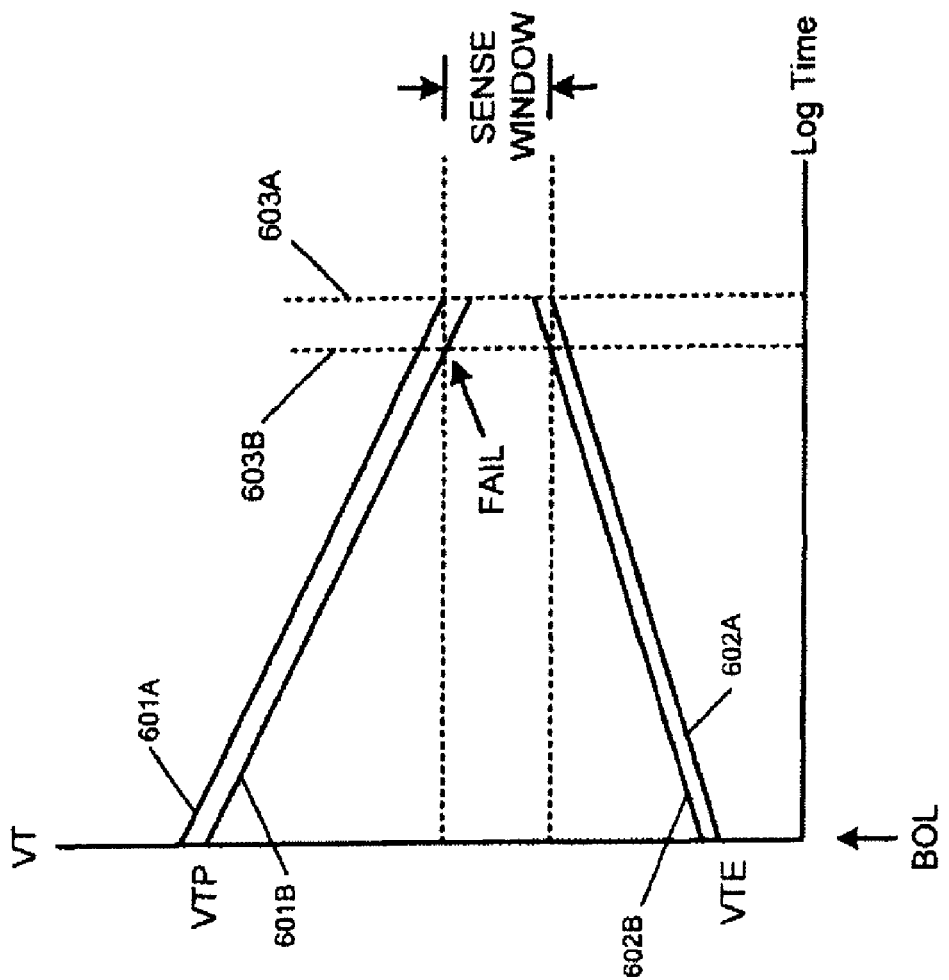
FIG. 6B is a graph illustrating an equalization of of-lfe program threshold voltage and end-of-life erase threshold voltage in one embodiment.

FIG. 6A is a graph illustrating a relationship between bit line disturb after 1 million endurance cycles and a single inhibit disturb at a specified $V_{INH}$ and $V_{RL1}$ as a function of program pulse width in one embodiment. As illustrated in FIG. 6A, for the exemplary device (e.g., memory transistor 334), a cumulative bit line disturb of 100 millivolts and an inhibit disturb of approximately 200 millivolts may be achieved at a program pulse width of approximately 5 milliseconds. In other embodiments, the two values (inhibit disturb and bit line disturb may be approximately equalized. This relationship can be used to maximize the data retention of given non-volatile, trapped-charge memory as illustrated in FIG. 6B. FIG. 6B is a graph 600 illustrating program and erase threshold voltage decay where voltage threshold shifts due to bit line disturb after 1 million endurance cycles and inhibit disturb have been equalized. In FIG. 6B, line 601A is the program threshold decay rate for an undisturbed memory cell, line 602A is the erase threshold voltage decay rate for an undisturbed memory cell and line 603A is the EOL of the undisturbed cell. Line 601B is the program threshold voltage decay rate after 1 million endurance cycles of bit line disturb, line 602B is the erase threshold voltage decay rate after 1 million bulk erase and inhibit cycles, and line 60313 is the EOL of the disturbed cell. As illustrated in FIG. 6B, the proper selection of inhibit voltage equalizes the program EOL with the erase EOL and maximizes the lifetime of the memory cell.

Figure 7:
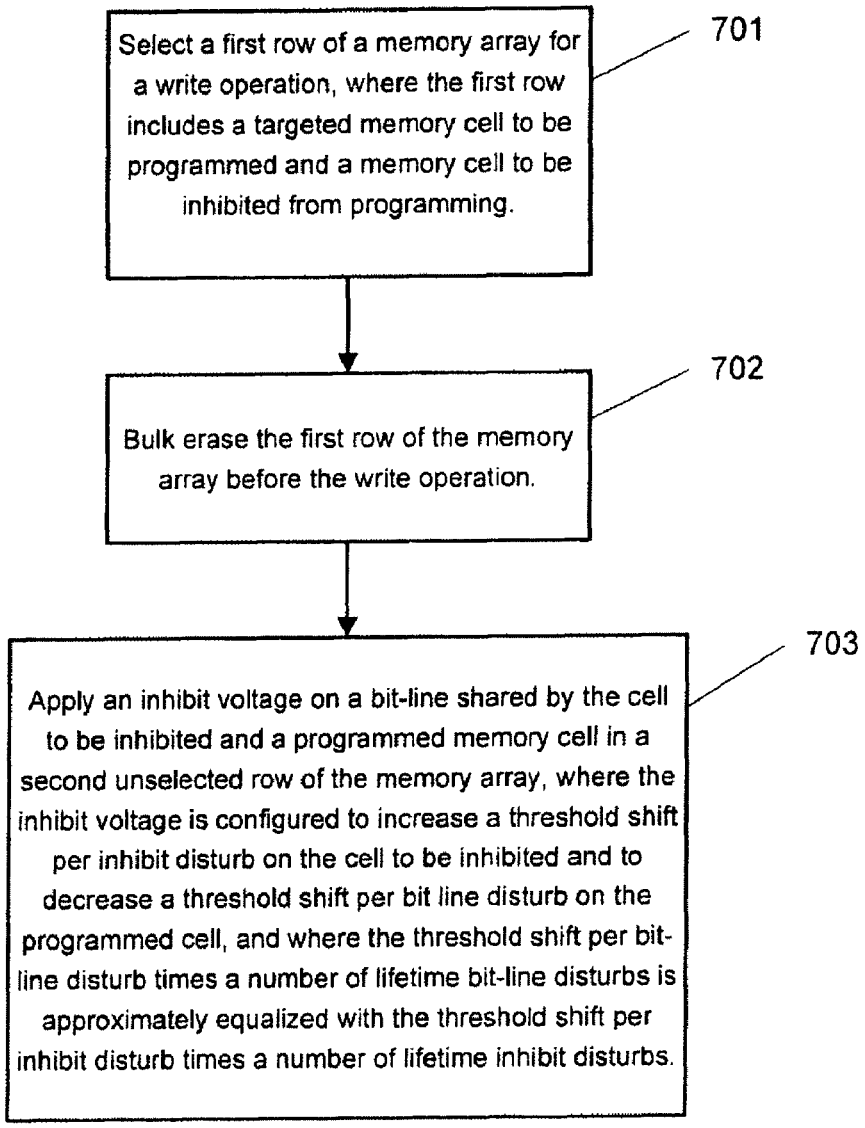
FIG. 7 is a flowchart illustrating a method for reducing bit line disturb in one embodiment.

FIG. 7 is a flowchart 700 illustrating a method for reducing bit line disturb in one embodiment. In FIG. 7, a first row of a memory array is selected for a write operation, where the first row includes a targeted memory cell to be programmed and an erased memory cell to be inhibited from programming (operation 701). In the next operation, the selected row is bulk erased (operation 702). In the next operation, an inhibit voltage is applied on a bit line shared by the cell to be inhibited and a programmed memory cell in a second, unselected row of the memory array, where the inhibit voltage is configured to increase a threshold voltage shift per inhibit disturb on the cell to be inhibited and to decrease a threshold shift per bit line disturb on the programmed cell, where the threshold shift per bit line disturb times a number of lifetime bit line disturbs is approximately equalized with the threshold shift of a single inhibit disturb (operation 703).

Figure 8:
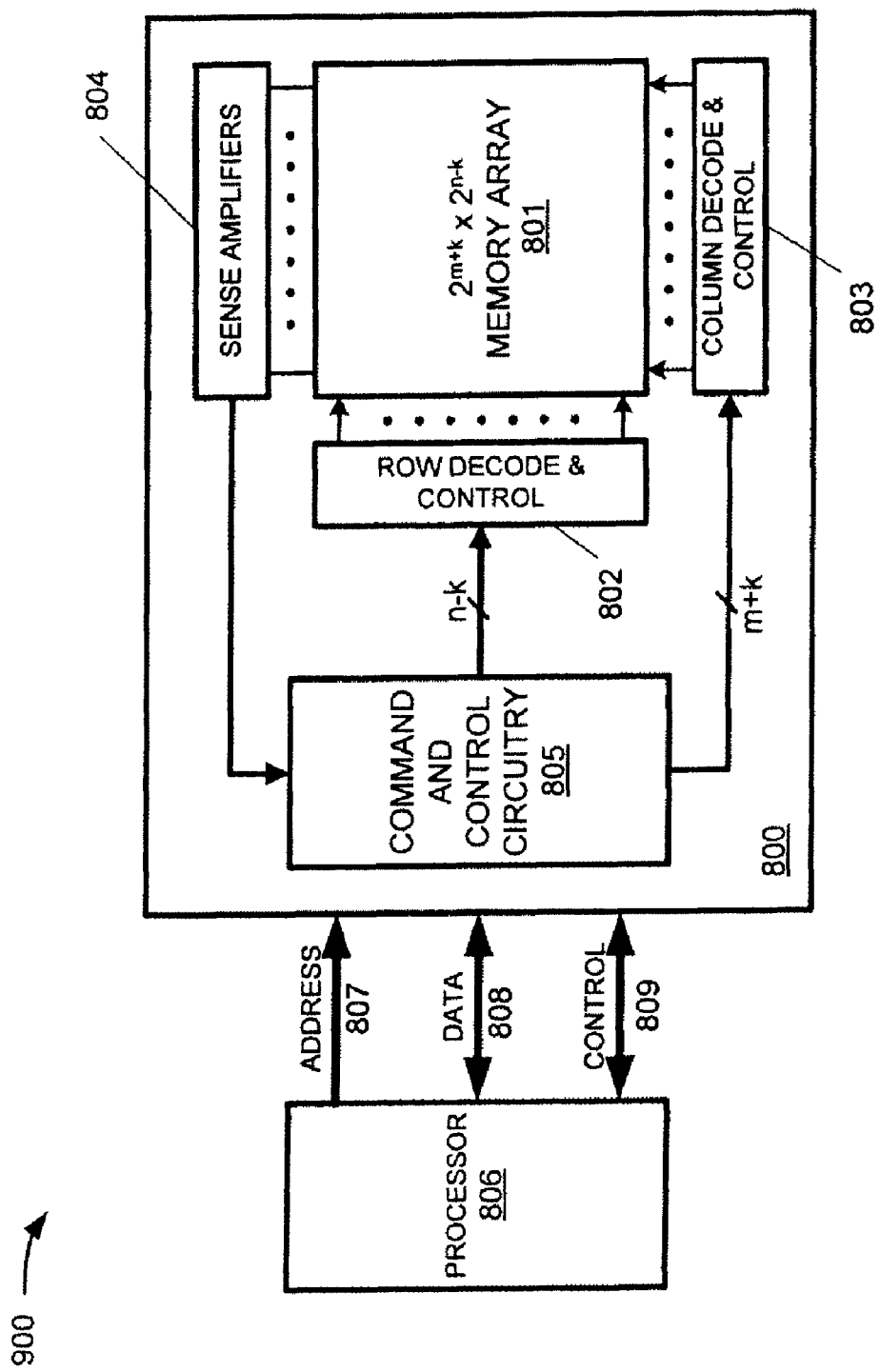
FIG. 8 is a block diagram illustrating a processing system in which embodiments of the invention may be implemented.

FIG. 8 is a block diagram of processing system 900 including a SONOS-type memory 800 according to one embodiment of the invention. In FIG. 8, the SONOS-type memory 800 includes a SONOS-type memory array 801, which may be an organized as rows and columns of SONOS-type memory cells as described above. In one embodiment, memory array 801 may be an array of $2^{m+k}$ columns by $2^{n-k}$ rows of memory cells (such as memory cell 200) where k is the length of a data word in bits. Memory array 801 may be coupled to a row decoder and controller 802 via $2^{n-k}$ word lines (such as word lines 322 and 324) and by $2^{n-k}$ read lines (such as read lines 321 and 323) 802A as described above. Memory array 801 may also be coupled to a column decoder and controller 802 via 2 m+k source lines (such as source lines 311 and 313) and by $2^{m+k}$ bit lines (such as bit lines 321 and 323) 803A as described above. Row and column decoders and controllers are known in the art and, accordingly, are not described in detail herein. Memory array 801 may also be coupled to a plurality of sense amplifiers 804 as are known in the art to read k-bit words from memory array 801. Memory 800 may also include command and control circuitry 805, as is known in the art, to control row decoder and controller 802, column decoder and controller 803 and sense amplifiers 804, and also to receive read data from sense amplifiers 804.

Memory 800 may also be coupled to a processor 806 in a conventional manner via an address bus 807, a data bus 808 and a control bus 809. Processor 806 may be any type of general purpose or special purpose processing device, for example.

In one embodiment, row controller 802 may be configured to select a first row of the memory array 801 for a write operation and to deselect a second row of the memory 801 array from the write operation. The column controller 803 may be configured to select a first memory cell in the first row (e.g., cell 301) for programming and to inhibit a second memory cell in the first row (e.g., cell 302) from programming. The column controller 803 may be configured to apply an inhibit voltage on a first bit-line shared by the second memory cell and a third, programmed memory cell (e.g., cell 304) in an unselected row of the memory array, where the inhibit voltage is configured to increase a soft-programming voltage across the second memory cell and to decrease a soft-erase voltage across the third memory cell. The soft-programming and soft-erase voltages may be selected such that a bit line disturb end-of-life of the programmed memory cell is approximately equalized with the inhibit disturb end-of-life of the inhibited cell.

Although the present invention has been described with reference to specific exemplary embodiments, it will be evident that various modifications and changes may be made to these embodiments without departing from the broader spirit and scope of the invention as set forth in the claims. Accordingly, the specification and drawings are to be regarded in an illustrative rather than a restrictive sense.

What is claimed is:

1. A method for programming an array of memory cells, comprising:
   performing a write operation on a first row of memory cells in the array,
      wherein the first row comprises a targeted memory cell to be written to and an inhibited memory cell which is not written to,
      wherein the inhibited memory cell shares a bit line with a programmed memory cell in a second row of the array of memory cells,
      wherein the inhibited memory cell comprises a gate-to-drain voltage of a first magnitude,
      wherein the programmed memory cell comprises a gate-to-drain voltage of a second magnitude, and wherein the first magnitude is greater than the second magnitude.

2. The method of claim 1, wherein each memory cell comprises a select transistor and a memory transistor with a charge trapping layer.

3. The method of claim 2, wherein the memory transistor includes a first gate connected with a word line, and
wherein the select transistor includes a second gate connected with a read line.

4. The method of claim 1, further comprising erasing the first row of memory cells in the array before performing the write operation.

5. The method of claim 1, wherein the first row of memory cells are connected with a first write line and the second row of memory cells are connected with a second write line.

6. The method of claim 5, further comprising:
applying a first programming voltage to the first write line; and
applying a second programming voltage to the second write line,
wherein first programming voltage is greater in magnitude than the second programming voltage.

7. A method for programming an array of memory cells, the array including a first row of memory cells connected with a first word line, wherein the first row comprises a targeted memory cell to be written to and an inhibited memory cell which is not written to, and wherein the inhibited memory cell shares a first bit line with a programmed memory cell in a second row of the array, comprising:
performing a write operation on the first row of memory cells,
wherein a first programming voltage is applied to the first word line,
wherein a second programming voltage is applied to a second word line connecting memory cells in the second row,
wherein the first programming voltage is greater in magnitude than or equal to the second programming voltage,
wherein the inhibited memory cell comprises a gate-to-drain voltage of a first magnitude,
wherein the programmed memory cell comprises a gate-to-drain voltage of a second magnitude, and
wherein the first magnitude is greater than the second magnitude.

8. The method of claim 7, wherein each memory cell comprises a select transistor and a memory transistor with a charge trapping layer.

9. The method of claim 8, wherein the memory transistor includes a first gate connected with a word line, and
wherein the select transistor includes a second gate connected with a read line.

10. The method of claim 7, further comprising erasing the first row of memory cells in the array before performing the write operation.

11. A method for programming an array of memory cells, the array including a first row of memory cells connected with a first word line, wherein the first row comprises a targeted memory cell to be written to and an inhibited memory cell which is not written to, and wherein the inhibited memory cell shares a first bit line with a programmed memory cell in a second row of the array, comprising:
performing a write operation on the first row of memory cells,
wherein a first programming voltage is applied to the first word line
wherein a second programming voltage is applied to a second word line connecting memory cells in the second row,
wherein the first programming voltage is about 6.2 V, and
wherein the second programming voltage is about −3.8 V.

12. A method for programming an array of memory cells, the array including a first row of memory cells connected with a first word line,
wherein the first row comprises a targeted memory cell to be written to and an inhibited memory cell which is not written to,
wherein the inhibited memory cell shares a first bit line with a programmed memory cell in a second row of the array,
wherein the inhibited memory cell comprises a gate-to-drain voltage of a first magnitude, and
wherein the programmed memory cell comprises a gate-to-drain voltage of a second magnitude, comprising:
performing a write operation on the first row of memory cells,
wherein an inhibit voltage is applied to the first bit line, and
wherein the value of the inhibit voltage causes the first magnitude to be greater than the second magnitude.

13. The method of claim 12, wherein each memory cell comprises a select transistor and a memory transistor with a charge trapping layer.

14. The method of claim 13, wherein the memory transistor includes a first gate connected with a word line, and
wherein the select transistor includes a second gate connected with a read line.

15. The method of claim 13, where the memory transistor includes a source connected with a drain of the select transistor.

16. The method of claim 12, further comprising erasing the first row of memory cells in the array before performing the write operation.

17. The method of claim 12, wherein the first magnitude is greater than the second magnitude.

18. The method of claim 12, wherein a first programming voltage is applied to the first word line,
wherein a second programming voltage is applied to a second word line connecting memory cells in the second row, and
wherein the first programming voltage is greater in magnitude than the second programming voltage.

19. The method in claim 12, wherein the inhibited memory cell comprises a gate-to-drain voltage of about 6.2 V, and
wherein the programmed memory cell comprises a gate-to-drain voltage of about −3.8 V.

* * * * *